US006957413B1

(12) United States Patent
McKeone et al.

(10) Patent No.: US 6,957,413 B1
(45) Date of Patent: Oct. 18, 2005

(54) SYSTEM AND METHOD FOR SPECIFYING INTEGRATED CIRCUIT PROBE LOCATIONS

(75) Inventors: Tom McKeone, Austin, TX (US); Bruce A. Loyer, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 220 days.

(21) Appl. No.: 10/185,288

(22) Filed: Jun. 27, 2002

(51) Int. Cl.$^7$ ............................................. G06F 17/50
(52) U.S. Cl. .......................................... 716/18; 716/8
(58) Field of Search .................. 716/1, 2, 4, 5, 716/18, 8–10

(56) References Cited

U.S. PATENT DOCUMENTS

| | | | |
|---|---|---|---|
| 5,325,309 A * | 6/1994 | Halaviati et al. | ............. 703/15 |
| 5,530,372 A * | 6/1996 | Lee et al. | ................... 324/758 |
| 5,675,499 A * | 10/1997 | Lee et al. | ...................... 716/19 |
| 5,920,765 A | 7/1999 | Naum et al. | |
| 5,974,245 A | 10/1999 | Li et al. | |
| 6,020,746 A | 2/2000 | Livengood | |
| 6,262,489 B1 | 7/2001 | Koors et al. | |
| 6,281,029 B1 | 8/2001 | Goruganthu et al. | |
| 6,300,148 B1 | 10/2001 | Birdsley et al. | |
| 6,345,379 B1 | 2/2002 | Khouja et al. | |
| 6,378,114 B1 | 4/2002 | Shenoy et al. | |
| 6,453,437 B1 * | 9/2002 | Kapur et al. | ................. 714/741 |
| 6,618,839 B1 * | 9/2003 | Beardslee et al. | ............. 716/4 |

OTHER PUBLICATIONS

Livengodd, Richard, et al., "Design for (Physical) debug for silicon microsurgery and probing of flip-chip packaged integrated circuits", 1999, IEEE, ppgs. 877-882.*
FlipChips Dot Com, Tutorial #1, "Introduction to Flip Chip: What, Why, How", printed from http://www.flipchips.com/tutorial101.html on Apr. 24, 2002, 4 pages.
FlipChips Dot Com, "Chapter B: Flip-Chip Technology," printed from http://extra.ivf.se/ngl/B-Flip-Chip/ChapterB1.htm on Apr. 24, 2002, 7 pages.
Amkor Technology, Inc. 1996-2002, "Flip Chip Packaging Technology Solution," printed from http://www/amkor.com/enablingtechnologies/FlipChip/index.cfm on Apr. 24, 2002, 6 pages.
"An Independent Jounal Dedicated to the Advancement of Chip Scale Electronics," Jul.-Aug. 2000, printed from http://www.chipscalereview.com/0700/flip8.html on Apr. 24, 2002, 3 pages.

* cited by examiner

Primary Examiner—Stacy A. Whitmore
(74) Attorney, Agent, or Firm—Robert C. Kowert; Meyertons, Hood, Kivlin, Kowert & Goetzel, P.C.

(57) ABSTRACT

A method for including probe locations in an integrated circuit may include specifying probe cells prior to the place and route stage of the design process. The probe cell locations may be specified in a functional description of the integrated circuit, such as an HDL description from which a netlist may be generated. Alternatively, an existing netlist may be edited to include the probe cells on specified nets. The probe locations are included in the physical layout design along with the rest of the integrated circuit components during place and route. The integrated circuit may be fabricated according to the physical layout design so that the fabricated integrated circuit includes the one or more probe locations.

21 Claims, 7 Drawing Sheets

SYSTEM AND METHOD FOR SPECIFYING INTEGRATED CIRCUIT PROBE LOCATIONS

BACKGROUND

1. Field of the Invention

This invention relates to design of integrated circuits, and more particularly to inclusion of probe cells in an integrated circuit design for probing of the integrated circuit.

2. Description of the Related Art

During manufacture of an integrated circuit (e.g., a microprocessor), electronic components are formed upon and within a frontside surface of a semiconductor substrate having opposed frontside and backside surfaces. The electronic components are connected together by electrically conductive interconnect lines referred to as signal lines, forming an electronic circuit. Signal lines, for connecting to external devices, may be terminated at flat metal contact regions called input/output (I/O) pads. Following manufacture, the integrated circuit, also referred to as chip, is typically secured within a protective semiconductor device package (e.g., carrier). Each I/O pad of the chip is then connected to one or more terminals of the device package. The terminals of a device package may be arranged in a two-dimensional array across an underside surface of the device package or may be arranged about the periphery of the package. The I/O pads of the chip are electrically connected to the terminals of the device package. Conductive bumps are used with some types of device packages to connect the I/O pads of the underside surface of the chip to the terminals. Wire connections are used with other types of device packages to connect the I/O pads of the chip to the terminals using wire bonding technology. The chip may be attached to another semiconductor substrate, a printed circuit board (PCB), or a carrier using a variety of methods and technologies.

As integrated circuit fabrication technology has improved, manufacturers have been able to integrate more and more functions onto single silicon substrates. As the number of functions on a single chip has increased, however, the number of signal lines which need to be connected to external devices has also increased. The corresponding numbers of required I/O pads and device package terminals have increased as well, as have the design and testing complexities of the chips, device packages and PCBs. As integrated circuit fabrication technology advances, various chip packaging techniques are being proposed and adopted to specifically address issues resulting from the continual increase of functions on a single chip.

One chip packaging technology adopted is a grid array semiconductor device package having terminals arranged in a two-dimensional array across an underside surface of the device package. FIG. 1 illustrates a cross-section view of one type of grid array device package, an exemplary ball grid array (BGA) device 10 including an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a frontside surface of semiconductor substrate 20 during wafer fabrication. The electronic components are connected by electrically conductive signal lines, forming an electronic circuit. Multiple I/O pads 24 are also formed within circuit layer 22. I/O pads 24 are typically coated with solder, forming solder bumps 26.

The integrated circuit 12 is attached to the package substrate 14 using a controlled collapse chip connection (C4) or flip chip packaging method. Flip chip packaging may also be referred to as Direct Chip Attach (DCA) since the chip may be directly attached to substrates, PCBs, or carriers. During a flip chip mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate 14. After integrated circuit 12 is attached to package substrate 14, the region between integrated circuit 12 and package substrate 14 may be filled with an "underfill" material 28 which encapsulates the connections of the chip and provides other mechanical advantages.

Package substrate 14 may be made of, for example, fiberglass-epoxy printed circuit board material or ceramic material (e.g., aluminum oxide, alumina, $Al_2O_3$, or aluminum nitride, AlN). Package substrate 14 includes one or more layers of signal lines referred to as interconnects, which connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted, for example, to an ordinary PCB. During PCB assembly, BGA device 10 is attached to the PCB by reflow of solder balls 30 just as the integrated circuit is attached to the package substrate 14. Other flip chip-in-package solutions, such as chip scale packages (CSP), may be used instead of BGA to attach an integrated circuit to device packages. The integrated circuit may also be attached directly to a PCB (e.g., no device package) and then encapsulated for protection as a flip chip-on-board.

Following manufacture, the chip may be tested to ensure the integrated circuit will perform as designed. Some integrated circuits may be probed from the frontside for testing. However, the flip chip mounting of integrated circuit 12 to package substrate 14 prevents physical access to circuit layer 22 for failure analysis and fault isolation during test. When a chip fails or when testing of the chip is performed, access to electronic components of the chip may only be possible from the backside of the device. Thus, several analytic and diagnostic techniques developed to reveal defects and logic states within integrated circuits have become useful when applied to flip chip packaged integrated circuits such as the integrated circuit 12 in BGA 10. One of these techniques is backside probing. Backside probing involves making electrical contact to probe certain nodes of the integrated circuit. When backside probing an integrated circuit, the chip is typically accessed by one or more probes configured to make electrical contact with backside probe locations on the chip which connect to nodes of the integrated circuit. The nodes of the integrated circuit may then be probed from the backside of the chip. The integrated circuit may be analyzed by activating or measuring the nodes of the integrated circuit through a backside test device.

Probe locations are typically added during the physical layout of the integrated circuit. However, it may be difficult to rearrange congested areas of the integrated circuit to make room for probe locations. In addition, if probe locations are added for every node, unnecessary delay may be added to many nodes of the integrated circuit.

SUMMARY

A method for including probe locations in an integrated circuit may include specifying one or more probe cells in a netlist. The netlist represents a functional design for an integrated circuit. The method may further include mapping the netlist into a physical layout design for the integrated circuit. The physical layout design includes one or more probe locations for one or more nodes of the integrated circuit as specified in the netlist. The integrated circuit may be fabricated according to the physical layout design so that the fabricated integrated circuit includes the one or more backside probe locations. The integrated circuit may be fabricated at least partially on the frontside of a semiconductor substrate. The one or more probe locations of the integrated circuit provide an electrical contact to probe one or more corresponding nodes of the integrated circuit from a frontside or backside of the semiconductor substrate. The integrated circuit may be tested by measuring one or more characteristics of the integrated circuit by probing the one or more probe locations from either the frontside or backside of the semiconductor substrate, depending on whether frontside or backside (or both) types of probe cells were included in the design.

The one or more probe cells may be specified in the netlist by indicating a location of each of one or more of the probe cells in a functional description of the integrated circuit, such as an HDL description. The netlist may be generated from the functional description. In another embodiment, an existing netlist may be edited to include the probe cells on specified nets.

In one embodiment, one or more integrated circuit design tools may be operable to generate a description representing a design for an integrated circuit. The description may specify one or more probe locations for one or more nodes of the integrated circuit. The one or more design tools may be operable to map the description to a physical layout design for the integrated circuit. The physical layout design may include one or more probe locations for one or more nodes of the integrated circuit as specified in the description. The physical layout design provides information for fabricating the integrated circuit to include the one or more probe locations according to the physical layout design. The one or more design tools may be stored in a memory of a computer system and be executable by one or more processors of the computer system.

While the invention is described herein by way of example for several embodiments and illustrative drawings, those skilled in the art will recognize the invention is not limited to the embodiments or drawings described. It should be understood that the drawings and detailed description thereto are not intended to limit the invention to the particular form disclosed, but on the contrary, the intention is to cover all modifications, equivalents and alternatives falling within the spirit and scope of the invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

Figure 1:
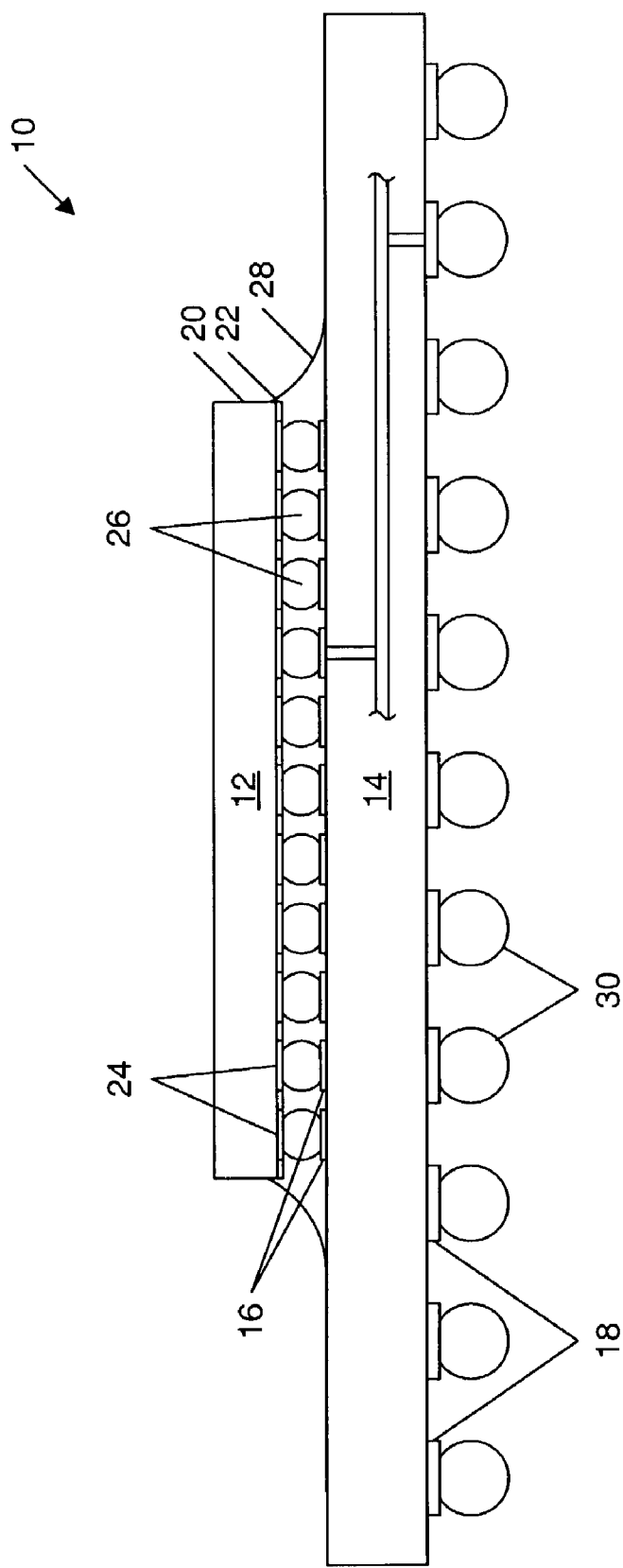
FIG. 1 illustrates a control collapse chip connection (C4) or flip chip packaged integrated circuit.
Figure 2:
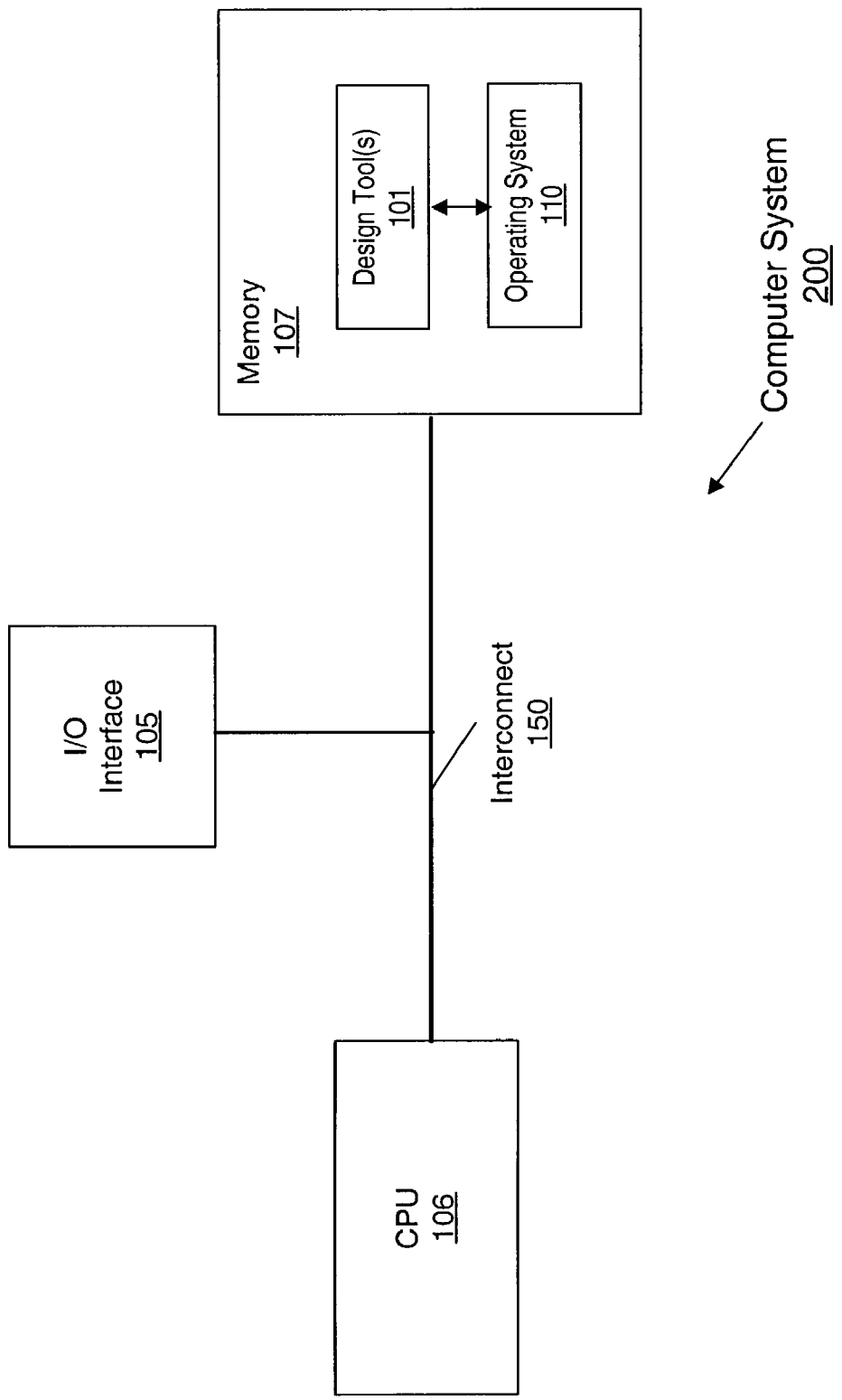
FIG. 2 illustrates a computer system including one or more design tools configured for including probe cells locations in an integrated circuit design, according to one embodiment.

FIG. 2 illustrates a computer system 200 that may execute design tool(s) 101 for including probe cells within an integrated circuit design, according to one embodiment. Computer system 200 may include components such as memory 107, at least one central processing unit (CPU) or processor 106, an input/output (I/O) interface 105, operating system 110 and device interconnect 150. Computer system 200 may further include other software and hardware components, and interconnect 150 for moving data from one component to another. Interconnect 150 may be a point-to-point interconnect, a shared bus, a combination of point-to-point interconnects and one or more buses, and/or a bus hierarchy including a system bus, CPU bus, memory bus and I/O buses such as peripheral component interconnect (PCI), universal serial bus (USB), and accelerated graphics port (AGP). Although not shown, an interconnect or bus controller, such as a bus bridge, may connect the interconnect 150 to various components or other bus bridges.

Memory 107 may store program instructions for computer programs, wherein the program instructions are executable by the CPU 106. In addition, any type of instructions and data accessed by CPU 106 may be stored in memory 107. For example, one or more computer programs with program instructions and data for design tools 101 may be stored in memory 107. The memory 107 is representative of various types of possible memory media, also referred to as "computer accessible media". Hard disk storage, floppy disk storage, removable disk storage, flash memory or random access memory (RAM) are examples of memory media. The terms "memory" and "memory medium" may include an installation medium, e.g., a CD-ROM or floppy disk, a computer system memory such as DRAM, SRAM, EDO RAM, SDRAM, DDR SDRAM, Rambus RAM, etc., or a non-volatile memory such as a magnetic media, e.g., a hard drive or optical storage. The memory medium may include other types of memory as well, or combinations thereof. In addition, the memory medium may be located in a first computer in which the computer programs are executed, or may be located in a second different computer which connects to the first computer over a network. In the latter instance, the second computer may provide the program instructions to the first computer for execution.

In different embodiments, the computer system 200 may take various forms, including a personal computer system, desktop computer, notebook computer, workstation, server, mainframe computer system, network appliance, network computer, Internet appliance, personal digital assistant (PDA), embedded device, smart phone, television system, another suitable device, or combinations thereof. In general, the term computer system may be broadly defined to encompass any device having a processor which executes instructions from a memory medium such as memory 107. Computer system 200 may be attached to a network as part of a distributed computing environment.

The computer system 200 may also include an input/output (I/O) interface 105 to various peripheral I/O devices and memory medium such as memory 107. The CPU 106 may acquire instructions and/or data through the I/O interface 105. Through the I/O interface 105, the CPU 106 may also be coupled to one or more I/O devices such as a network interface, video monitors or other displays, track balls, mice, keyboards, printers, plotters, scanners, storage devices, etc., or any other type of I/O device for use with computer system 200.

Computer system 200 may be configured to execute one or more computer programs. The computer programs may comprise an operating system 110 or other system software, application software, utility software, applets, and/or any other sequence of instructions. Typically, an operating system performs basic tasks such as recognizing input from the keyboard, sending output to the display screen, keeping track of files and directories on a disk, and controlling peripheral I/O devices such as scanners and printers. Application software runs under the control of the operating system 110 and provides additional functionality. In different embodiments, the operating system may be based on Windows NT from Microsoft, Inc., Solaris from Sun Microsystems, Inc., or any other operating system suitable for computer system 200. The application software may be stored in a memory medium such as the memory 107. Alternatively, the application software may be provided to the CPU 102 through the I/O interface 105. Application software may include design tools 101 for including probe cells within an integrated circuit design, according to one embodiment. Design tools 101 may be one or more software tools, or a suite of software tools, used to develop an integrated circuit design.

The following description pertains to specifying backside probe cell locations during the design of an integrated circuit. Although backside probe cells are used throughout to illustrate certain embodiments, other types of probe cells (such as frontside) maybe employed instead of or in addition to backside probe cells in other embodiments. Thus, the description is intended to cover all such embodiments.

Figure 3:
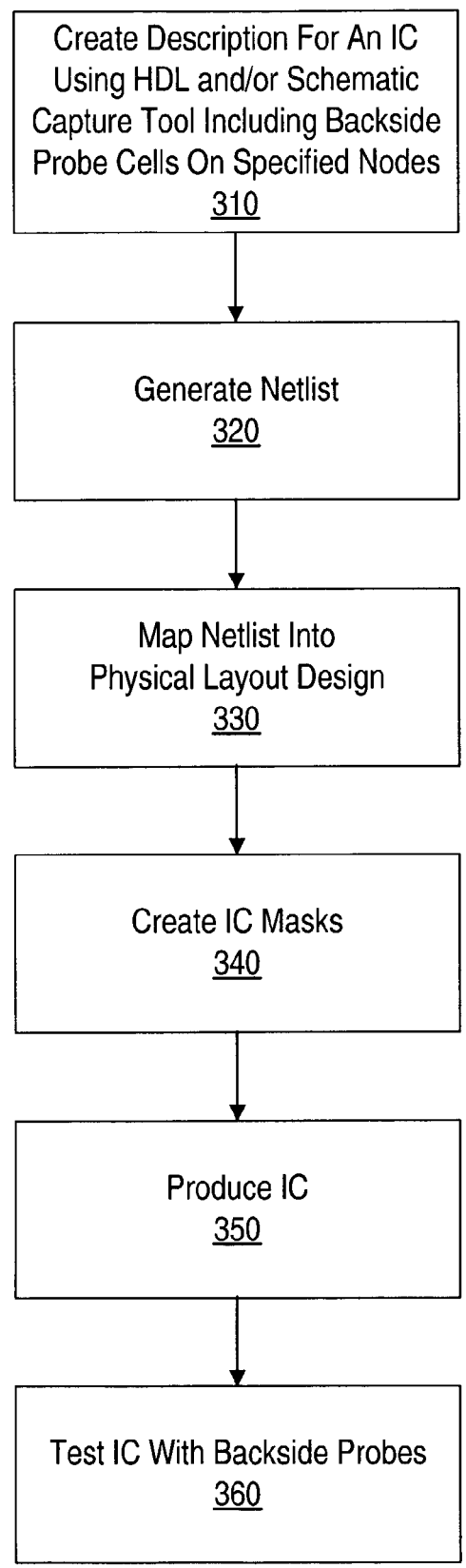
FIG. 3 is a flowchart illustrating a method for designing an integrated circuit with probe locations, according to one embodiment.

Turning to FIG. 3, a flowchart outlines a method for designing an integrated circuit using one or more embodiments of design tools, such as design tools 101 shown in FIG. 2. The design process may begin with representation of a conceptual design of an integrated circuit as a functional design description of the integrated circuit, as indicated in 310. The conceptual design may have been documented as a specification prior to or during creation of the functional design description. Creation of the functional design description may address design issues such as what functions will the integrated circuit perform and what are the performance parameters and/or constraints (e.g., time, speed, etc.) associated with each function.

A design tool used to create the functional design description may support a hardware description language (HDL). A HDL may be used to translate a conceptual design into a functional design description, or to create a synthesis source description of a conceptual design. For example, Very High Speed Integrated Circuit (VHSIC) Hardware Description Language (VHDL), Verilog or any other suitable language may be used to translate the conceptual design into the functional design description or synthesis source description. In one embodiment, the design tool may be configured to generate and/or edit HDL, or objects associated with HDL, and to display a graphical user interface for interactive control by a user. Alternatively, or additionally, the design tool may include a schematic capture tool configured to display and edit the functional design description as a schematic using a graphical user interface. In another embodiment, or additionally, the design tool may be used to write and/or modify the functional design description or synthesis source description using a HDL without a graphical user interface.

The functional design description may be created using a library of cells, components or logic elements. The cells may provide an abstract view of the transistors and/or other circuit devices of the integrated circuit. A cell may represent, for example, various transistors, and may implement various logic gates such as invertors, AND, NAND, flip-flops, multiplexors, or larger functional units such as adders, memory arrays, registers, etc. A semiconductor supplier, for example, may have characterized electrical behavior or performance constraints of the cells and may have provided the library of cells for use during design of complex integrated circuits. In one embodiment, the supplier may have provided location or distance constraints for the cells. The supplier may have provided estimates of time delays as a function of each cell. Thus, the library of cells may have been used to create the functional design description.

The library of cells may include a backside probe cell to identify locations for probing the integrating circuit during testing after production of the chip. Backside probe cells may identify locations for electrical contact to particular nodes of the integrated circuit from the backside of the integrated circuit. In one embodiment, the location of backside probe cells may be specified in the HDL functional design description of the integrated circuit. In another embodiment, or additionally, the location of backside probe cells may be specified during schematic capture of the functional design using a schematic capture tool. Thus, the functional design description may be created for an integrated circuit using the design tool enabling inclusion of backside probe cells on specified nodes.

As indicated in 320, the functional design description or synthesis source description may be synthesized by using the design tool to generate a netlist. The design tool may translate the synthesis source description of the design into the netlist. The cells included in the netlist may represent the implementation of the functions described in the HDL. The netlist may be considered a template which will be used to transform the design into a physical representation of the integrated circuit prior to fabrication. The netlist may specify how cells or components will be connected to satisfy the specification of the integrated circuit described in the HDL. The netlist may specify how one or more components may be connected to other components, but may not specify a particular wiring topography. This interconnection between the cells may be referred to as nets. The netlist may also specify nets that connect backside probe cells as specified in the functional design description or synthesis source description.

After the netlist has been generated, the netlist may be mapped into a physical layout design of the integrated circuit, or the "place and route" of the cells onto the integrated circuit design, as indicated in 330. The physical layout design shows where the integrated circuit components (including backside probe locations), as represented by the cells identified in 310, will be placed on an integrated circuit substrate. In addition, the physical layout design shows how the connections between the cells will be routed or wired on the integrated circuit substrate. Thus, the actual placement of the cells may include assigning an exact location to each of the cells. The location may be represented as a coordinate (x, y) on the integrated circuit substrate. The connections between the electronic devices, as shown on the physical layout design, are defined to specify a particular wiring topography for the routing or interconnections of the electronic devices for fabrication.

Once the netlist has been mapped into a physical layout design, the integrated circuit may be simulated to ensure the integrated circuit will perform as designed. If a portion of the integrated circuit does not function as specified in the design, the physical design layout may be modified to correct the identified problem. Testing, by simulation, an integrated circuit design layout may involve repetitive debugging, correcting and retesting of the circuit as part of the test process during design.

After the physical layout design is finalized, the physical layout design may be output as a transistor level netlist, a file with data formatted in Caltech Intermediate Form (CIF), or some other suitable output that may be used to create a set of masks for the integrated circuit. CIF, for example, provides a standard, machine-readable representation of mask features. Any output format suitable for providing a geometric representation of integrated circuit features for creating a set of masks may be used.

Once the physical layout design of the integrated circuit has been finalized, one of the design tools may be used to create the set of masks for the integrated circuit, as indicated in 340. Production of the integrated circuit may be completed, as indicated in 350, by using the set of masks in a semiconductor fabrication process (e.g., employing photolithography, etc.). For example, the set of masks may be used in the semiconductor fabrication process to transfer a pattern (e.g., set of masks) to the surface of a wafer or substrate. Backside probe locations may be included as specified in the design phase. Backside probe locations, as identified by the backside probe cells, may be fabricated using a variety of methods. The backside probe locations may be exposed or accessed by milling away a portion of the integrated circuit substrate backside to allow contact from the backside. The substrate backside may be thinned in a particular region of the integrated circuit using a polishing technique, for example.

Following manufacture, the integrated circuit may be tested to ensure the integrated circuit will perform as designed and produced, as indicated in 360. It may be desirable to access nodes of the integrated circuit for failure analysis and fault isolation. Nodes of the integrated circuit may be accessed to obtain electrical data from the integrated circuit. For example, timing delay information or voltage levels may be obtained by accessing the nodes of the integrated circuit. If the chip is a flip chip packaged integrated circuit, for example, an integrated circuit layer is attached to an integrated circuit substrate face down. Backside probing may enable access to integrated circuit nodes via the backside of the flip chip packaged integrated circuit. Backside probing may involve making electrical contact to probe certain nodes of the integrated circuit layer. When probing the integrated circuit, the chip may be accessed by one or more probes configured to make electrical contact with backside probe locations on the chip which connect to nodes of the integrated circuit. The nodes of the chip may then be probed from the backside of the chip. The integrated circuit may be analyzed by activating or measuring the nodes of the integrated circuit through a backside test device.

Figure 4:
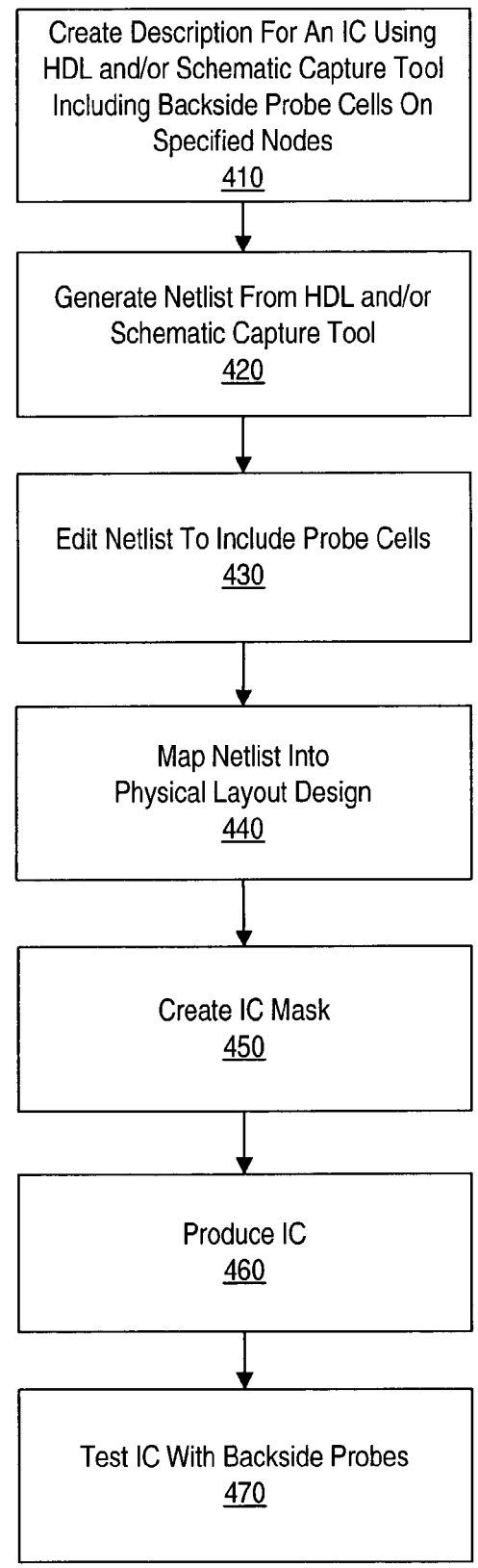
FIG. 4 is a flowchart illustrating a method for including probe cells into a netlist before a physical layout design is created for an integrated circuit, according to one embodiment.

Turning to FIG. 4, a flowchart outlines a method for designing an integrated circuit to include backside probe cells into a netlist before a physical layout design is created, or before a "place and route" of the cells onto the integrated circuit design, according to one embodiment. The design process, similar to the process described with FIG. 3, may begin with representation of a conceptual design of an integrated circuit as a functional design description of the integrated circuit, as indicated in 410. A design tool, such as design tool 101 shown in FIG. 2, may be used to create a functional design description or synthesis source description using, for example, a hardware description language (HDL). Instead of writing HDL, or in addition to HDL, a schematic capture tool may be used to generate a netlist. As indicated in 420, the functional design description or synthesis source description may be synthesized using part of the design tool configured to synthesize or generate the netlist. In one embodiment, the design tool may translate the synthesis source description of the design into the netlist.

Backside probe cells may be added or inserted into the netlist after the netlist has been generated using a netlist editor. In one embodiment, the netlist editor may be part of the design tool. The design tool may be configured to allow inclusion of backside probe cells into the netlist after generation of the netlist, and before creation of the physical layout design, as indicated in 430. The netlist may be edited to add backside probe cells on specified nets. The design tool may be a software application running on a computer system, as illustrated in FIG. 2, and may be accessible to a user (e.g., integrated circuit designer, CAD engineer, other process, etc.). In one embodiment, the design tool may be configured to provide functionality to enable a user of the design tool to add probe cells to the netlist before creation of the physical layout design during the design process. In another embodiment, the design tool may be a mechanism configured to modify an existing netlist by adding backside probe cells before another design tool uses the netlist to create the physical layout design. For example, the mechanism may insert backside probe cells into the existing netlist without the involvement of a user.

The design tool may be a software application, software program instructions, one or more modules of a computer system, software package, software suite, etc. For example, the design tool may be a computer-aided design (CAD) system, an electronic design automation (EDA) package, a logic synthesis program or a mechanism initiated by an application external to the program instructions for the mechanism. The design tool may include a command line interface or a graphical user interface (or both) for providing editing access to the netlist for inserting backside probe cells. The design tool may be implemented in a variety of ways, using a variety of programming languages, including procedure-based techniques, component-based techniques, and/or object-oriented techniques, among others. For example, the design tool may be a CAD system written with C++ for use in a distributed computing environment.

After the netlist has been generated, and edited to include backside probe cells on specified nodes, the netlist may be mapped into the physical layout design of the integrated circuit, or the "place and route" of the cells onto the integrated circuit, as indicated in 440. Once the physical layout design of the integrated circuit has been finalized, one of the design tools may be used to create the set of masks for the integrated circuit, as indicated in 450. Production of the integrated circuit may be completed, as indicated in 460, by using the set of masks in a semiconductor fabrication process, such as photolithography. Following manufacture, the integrated circuit may be tested through backside probing to ensure the integrated circuit will perform as designed and produced, as indicated in 470.

The design tool may be configured to insert probe cells into the netlist before creation of the physical layout design, or before starting a place and route phase of the design process. The backside probe cell locations may be specified by the user of the design tool. Thus, the backside probe cells may be included in the physical layout design based on editing of the netlist to include backside probe cells before creation of the physical layout design. Particular nodes may be identified during design as critical for probing. Other nodes may be identified as not necessary for probing. For example, particular nodes may not be identified for backside probing to avoid adding probe cell delay to associated signal lines. Backside probe cell locations may be specified for select nodes as part of the functional design description or by editing the netlist. For example, an integrated circuit designer may identify critical nodes for backside probing and the design tool may be used to insert the corresponding backside probe cells for the particular nodes into the netlist before creation of the physical layout design.

Figure 5:
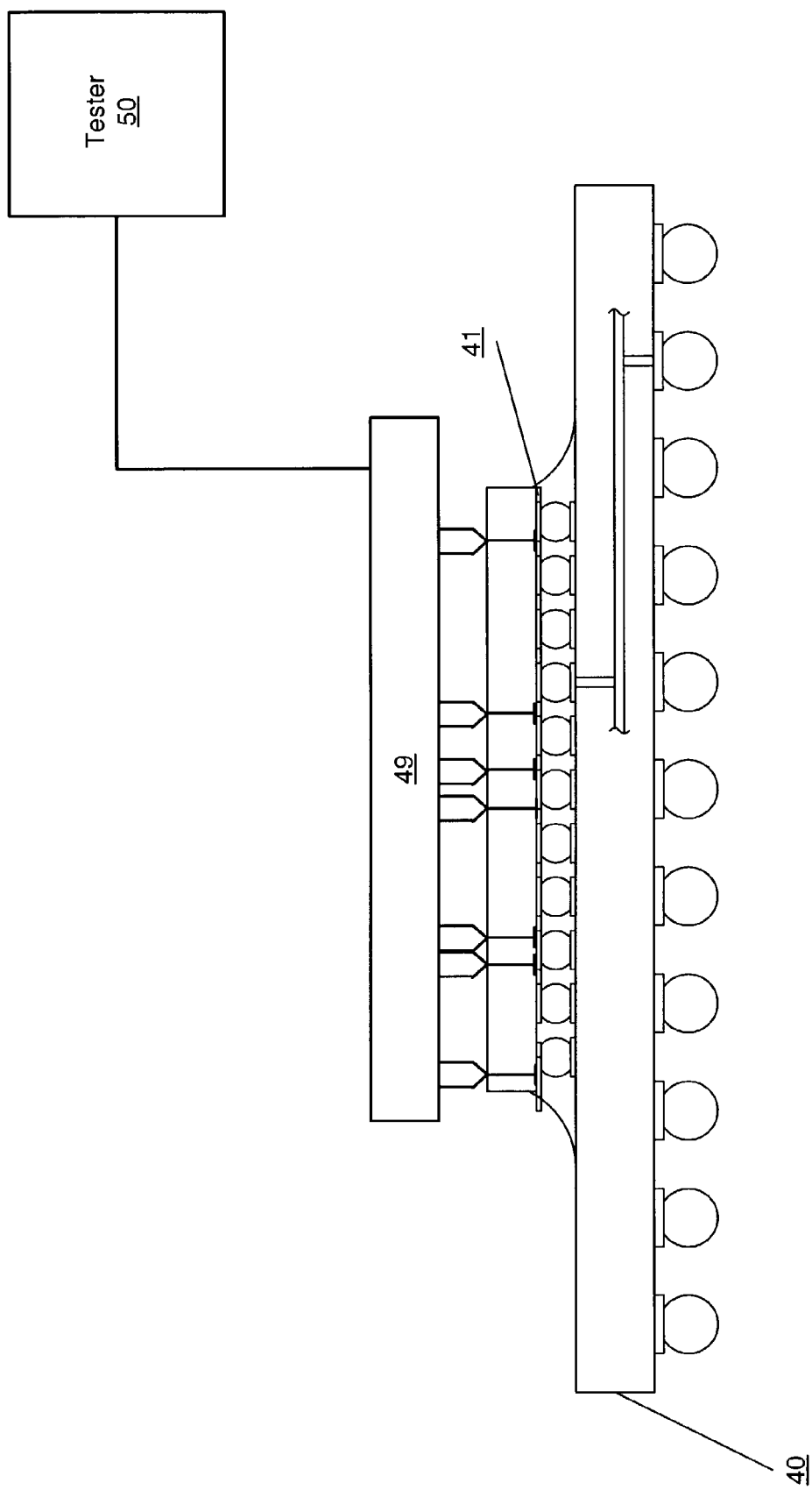
FIG. 5 is an illustration of a test system for testing an integrated circuit with probing, according to one embodiment.

According to one embodiment, FIG. 5 is an illustration of a test apparatus that may be used to test an integrated circuit designed by including backside probe cells into a netlist before creation of a physical layout design, as described above. Test equipment or tester 50 may be used to test the integrated circuit, such as a flip chip packaged integrated circuit 40, during backside probing. Test equipment 50 may be any test apparatus suitable for accessing components of the chip for failure analysis and fault isolation. The test apparatus may be suitable for measuring integrated circuit characteristics using one or more backside probes 49 during the backside probing process. Accessing the components of the chip via one or more backside probes 49 may allow for obtaining electrical data from the integrated circuit 40. Backside probing may involve making electrical contact to probe certain nodes of the integrated circuit on an integrated circuit layer 41 from the backside of integrated circuit 40. The nodes may have been identified by the backside probe cells including in the netlist before creation of the physical layout design. When probing the flip chip packaged integrated circuit 40, the chip may be accessed by the backside probes 49. The signal lines at various nodes, as accessed by the backside probe locations, are then analyzed by activating or measuring the signal lines through the backside probes 49.

Figure 6:
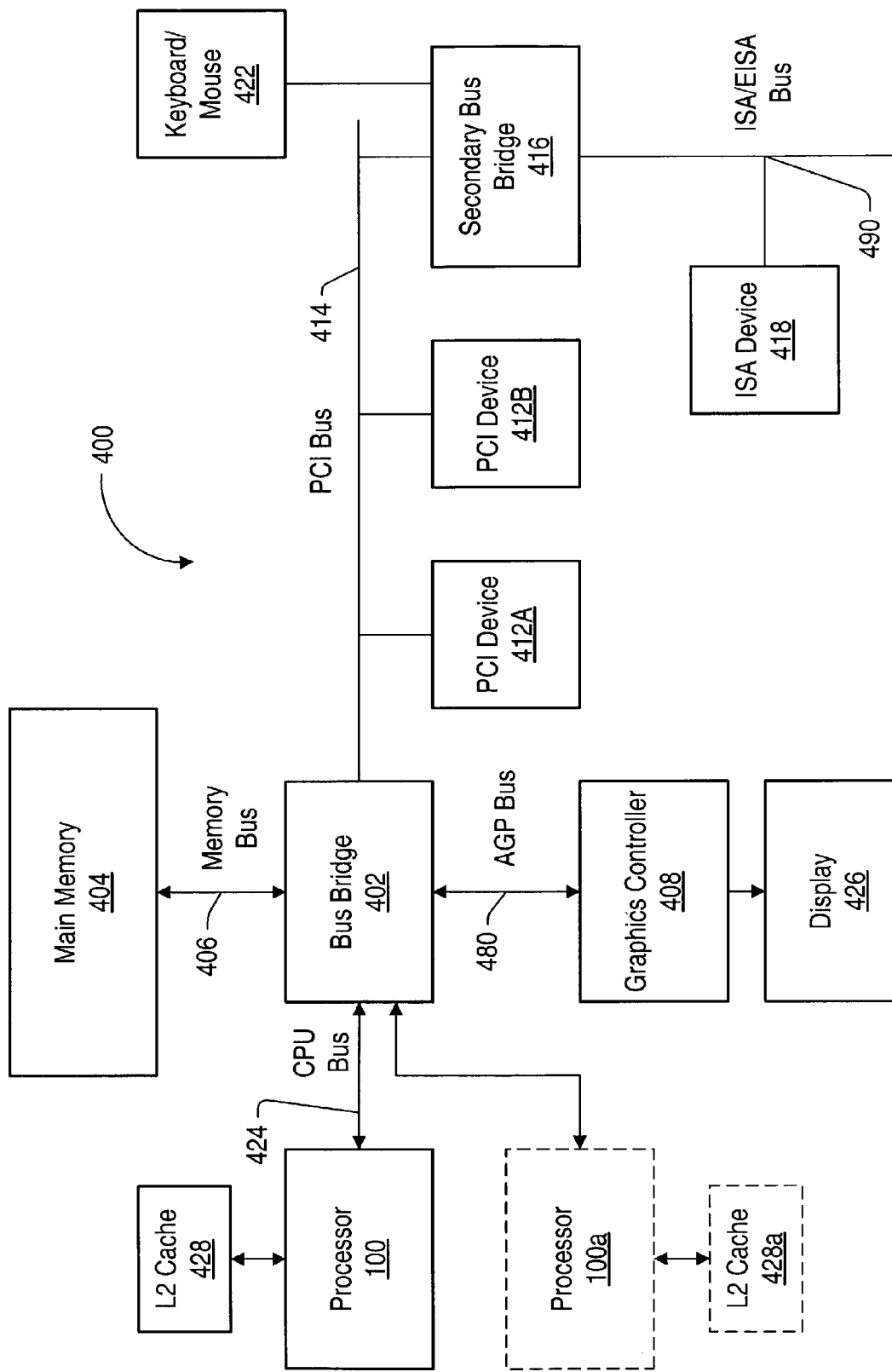
FIG. 6 is an illustration of a computer system that includes one or more integrated circuits designed to include probe cells, according to one embodiment.

Turning to FIG. 6, a block diagram shows one embodiment of a computer system 400 that includes a processor 100 coupled to a variety of system components through a bus bridge 402. The processor 100, or any integrated circuit in the computer system 400, may have been designed according to a system or method that included inserting backside probe cells into a netlist before using the netlist for creation of a physical layout design of processor 100 or other integrated circuit, as described above. In one embodiment, a design tool configured to allow a user to edit the netlist by inserting backside probe cells may have been used to create the physical layout design of processor 100. The processor 100 may have been tested using a suitable test apparatus for backside probing, as described with FIG. 5. Other embodiments of a computer system are possible and contemplated. In the depicted system, a main memory 404 is coupled to bus bridge 402 through a memory bus 406, and a graphics controller 408 is coupled to bus bridge 402 through an AGP bus 480. Several PCI devices 412A–412B are coupled to bus bridge 402 through a PCI bus 414. A secondary bus bridge 416 may also be provided to accommodate an electrical interface to one or more EISA or ISA devices 418 through an EISA/ISA bus 490. In this example, processor 100 is coupled to bus bridge 402 through a CPU bus 424 and to an optional L2 cache 428. In some embodiments, the processor 100 may include an integrated L1 cache (not shown).

Bus bridge 402 provides an interface between processor 100, main memory 404, graphics controller 408, and devices attached to PCI bus 414. When an operation is received from one of the devices connected to bus bridge 402, bus bridge 402 identifies the target of the operation (e.g., a particular device or, in the case of PCI bus 414, that the target is on PCI bus 414). Bus bridge 402 routes the operation to the targeted device. Bus bridge 402 generally translates an operation from the protocol used by the source device or bus to the protocol used by the target device or bus.

In addition to providing an interface to an ISA/EISA bus for PCI bus 414, secondary bus bridge 416 may incorporate additional functionality. An input/output controller (not shown), either external from or integrated with secondary bus bridge 416, may also be included within computer system 400 to provide operational support for a keyboard and mouse 422 and for various serial and parallel ports. An external cache unit (not shown) may also be coupled to CPU bus 424 between processor 100 and bus bridge 402 in other embodiments. Alternatively, the external cache may be coupled to bus bridge 402 and cache control logic for the external cache may be integrated into bus bridge 402. L2 cache 428 is shown in a backside configuration to processor 100. It is noted that L2 cache 428 may be separate from processor 100, integrated into a cartridge (e.g., slot 1 or slot A) with processor 100, or even integrated onto a semiconductor substrate with processor 100.

Main memory 404 is a memory in which application programs are stored and from which processor 100 primarily executes. A suitable main memory 404 comprises DRAM (Dynamic Random Access Memory). For example, a plurality of banks of SDRAM (Synchronous DRAM) or Rambus DRAM (RDRAM) may be suitable.

PCI devices 412A–412B are illustrative of a variety of peripheral devices such as network interface cards, video accelerators, audio cards, hard or floppy disk drives or drive controllers, SCSI (Small Computer Systems Interface) adapters and telephony cards. Similarly, ISA device 418 is illustrative of various types of peripheral devices, such as a modem, a sound card, and a variety of data acquisition cards such as GPIB or field bus interface cards.

Graphics controller 408 is provided to control the rendering of text and images on a display 426. Graphics controller 408 may embody a typical graphics accelerator generally known in the art to render three-dimensional data structures that can be effectively shifted into and from main memory 404. Graphics controller 408 may therefore be a master of AGP bus 480 in that it can request and receive access to a target interface within bus bridge 402 to thereby obtain access to main memory 404. A dedicated graphics bus accommodates rapid retrieval of data from main memory 404. For certain operations, graphics controller 408 may further be configured to generate PCI protocol transactions on AGP bus 480. The AGP interface of bus bridge 402 may thus include functionality to support both AGP protocol transactions as well as PCI protocol target and initiator transactions. Display 426 is any electronic display upon which an image or text can be presented. A suitable display 426 includes a cathode ray tube ("CRT"), a liquid crystal display ("LCD"), etc.

Although the AGP, PCI, and ISA or EISA buses have been used as examples in the above description, any bus architectures may be substituted as desired. It is further noted that computer system 400 may be a multiprocessing computer system including additional processors (e.g., processor 100a shown as an optional component of computer system 400). Processor 100a may be similar to processor 100. More particularly, processor 100a may be an identical copy of processor 100. Processor 100a may be connected to bus bridge 402 via an independent bus (as shown in FIG. 9) or may share CPU bus 224 with processor 100. Furthermore, processor 100a may be coupled to an optional L2 cache 428a similar to L2 cache 428.

Figure 7:
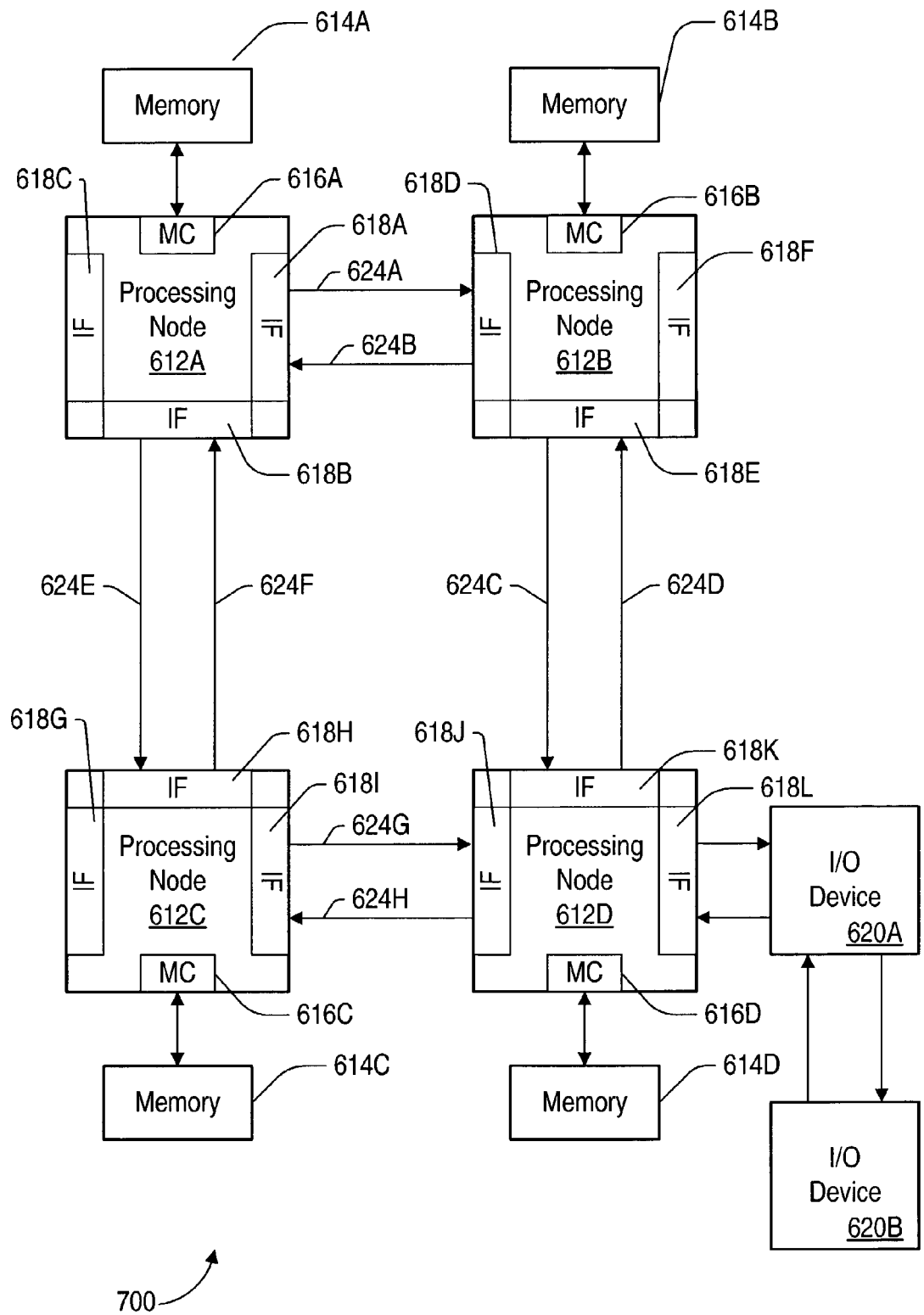
FIG. 7 is another illustration of a computer system that includes one or more integrated circuits designed to include probe cells, according to one embodiment.

Turning now to FIG. 7, another embodiment of a computer system 700 may include one or more integrated circuits may have been designed according to a system or method that included inserting backside probe cells into a netlist before using the netlist for creation of a physical layout design of processor 100 or other integrated circuit, as described with FIGS. 3 and 4. Other embodiments are possible and contemplated. In the embodiment of FIG. 7, computer system 700 includes several processing nodes 612A, 612B, 612C, and 612D. Each processing node is coupled to a respective memory 614A–614D via a memory controller 616A–616D included within each respective processing node 612A–612D. Additionally, processing nodes 612A–612D include interface logic used to communicate between the processing nodes 612A–612D. For example, processing node 612A includes interface logic 618A for communicating with processing node 612B, interface logic 618B for communicating with processing node 612C, and a third interface logic 618C for communicating with yet another processing node (not shown). Similarly, processing node 612B includes interface logic 618D, 618E, and 618F; processing node 612C includes interface logic 618G, 618H, and 618I; and processing node 612D includes interface logic 618J, 618K, and 618L. Processing node 612D is coupled to communicate with a plurality of input/output devices (e.g., devices 620A–620B in a daisy chain configuration) via interface logic 618L. Other processing nodes may communicate with other I/O devices in a similar fashion.

Processing nodes 612A–612D implement a packet-based link for inter-processing node communication. In the present embodiment, the link is implemented as sets of unidirectional lines (e.g., lines 624A are used to transmit packets from processing node 612A to processing node 612B and lines 624B are used to transmit packets from processing node 612B to processing node 612A). Other sets of lines 624C–624H are used to transmit packets between other processing nodes as illustrated in FIG. 7. Generally, each set of lines 624 may include one or more data lines, one or more clock lines corresponding to the data lines, and one or more control lines indicating the type of packet being conveyed. The link may be operated in a cache coherent fashion for communication between processing nodes or in a non-coherent fashion for communication between a processing node and an I/O device (or a bus bridge to an I/O bus of conventional construction such as the PCI bus or ISA bus). Furthermore, the link may be operated in a non-coherent fashion using a daisy-chain structure between I/O devices as shown. It is noted that a packet to be transmitted from one processing node to another may pass through one or more intermediate nodes. For example, a packet transmitted by processing node 612A to processing node 612D may pass through either processing node 612B or processing node 612C. Any suitable routing algorithm may be used. Other embodiments of computer system 700 may include more or fewer processing nodes then the embodiment shown in FIG. 7.

Generally, the packets may be transmitted as one or more bit times on the lines 624 between nodes. A bit time may be the rising or falling edge of the clock signal on the corresponding clock lines. The packets may include command packets for initiating transactions, probe packets for maintaining cache coherency, and response packets from responding to probes and commands.

Processing nodes 612A–612D, in addition to a memory controller and interface logic, may include one or more processors. Broadly speaking, a processing node comprises at least one processor and may optionally include a memory controller for communicating with a memory and other logic as desired. More particularly, each processing node 612A–612D may comprise one or more copies of processor 100. External interface unit 18 may includes the interface logic 618 within the node, as well as the memory controller 616.

Memories 614A–614D may comprise any suitable memory devices. For example, a memory 614A–614D may comprise one or more RAMBUS DRAMs (RDRAMs), synchronous DRAMs (SDRAMs), static RAM, etc. The address space of computer system 700 is divided among memories 614A–614D. Each processing node 612A–612D may include a memory map used to determine which addresses are mapped to which memories 614A–614D, and hence to which processing node 612A–612D a memory request for a particular address should be routed. In one embodiment, the coherency point for an address within computer system 700 is the memory controller 616A–616D coupled to the memory storing bytes corresponding to the address. In other words, the memory controller 616A–616D is responsible for ensuring that each memory access to the corresponding memory 614A–614D occurs in a cache coherent fashion. Memory controllers 616A–616D may comprise control circuitry for interfacing to memories 614A–614D. Additionally, memory controllers 616A–616D may include request queues for queuing memory requests.

Interface logic 618A–618L may comprise a variety of buffers for receiving packets from the link and for buffering packets to be transmitted upon the link. Computer system 700 may employ any suitable flow control mechanism for transmitting packets. For example, in one embodiment, each interface logic 618 stores a count of the number of each type of buffer within the receiver at the other end of the link to which that interface logic is connected. The interface logic does not transmit a packet unless the receiving interface logic has a free buffer to store the packet. As a receiving buffer is freed by routing a packet onward, the receiving interface logic transmits a message to the sending interface logic to indicate that the buffer has been freed. Such a mechanism may be referred to as a "coupon-based" system.

I/O devices 620A–620B may be any suitable I/O devices. For example, I/O devices 620A–620B may include devices for communicate with another computer system to which the devices may be coupled (e.g., network interface cards or modems). Furthermore, I/O devices 620A–620B may include video accelerators, audio cards, hard or floppy disk drives or drive controllers, SCSI (Small Computer Systems Interface) adapters and telephony cards, sound cards, and a variety of data acquisition cards such as GPIB or field bus interface cards. It is noted that the term "I/O device" and the term "peripheral device" may be synonymous.

Although FIGS. 6 and 7 illustrate computer systems, integrated circuits designed to include backside probe cells as described herein may be included in any type of electronic device such as appliances, mobile phones, personal digital assistants, etc.

Various modifications and changes may be made as would be obvious to a person skilled in the art having the benefit of this disclosure. For example, frontside probe cell locations may also be specified as described above. Note also that the flow charts described herein do not necessary require a temporal order. It is intended that the following claims be interpreted to embrace all such modifications and changes and, accordingly, the specifications and drawings are to be regarded in an illustrative rather than a restrictive sense.

Various embodiments may further include receiving, sending or storing instructions and/or data implemented in accordance with the foregoing description upon a computer accessible medium. Generally speaking, a computer accessible medium may include storage media or memory media such as magnetic or optical media, e.g., disk or CD-ROM, volatile or non-volatile media such as RAM (e.g. SDRAM, DDR SDRAM, RDRAM, SRAM, etc.), ROM, etc. as well as transmission media or signals such as electrical, electromagnetic, or digital signals, conveyed via a communication medium such as network and/or a wireless link.

What is claimed is:

1. A method, comprising:
   specifying one or more probe cells in a netlist, wherein the netlist represents a functional design for an integrated circuit, and wherein each one of the probe cells represents a probe location that provides an electrical contact to externally probe one or more corresponding nodes of the integrated circuit;
   mapping the netlist into a physical layout design for the integrated circuit, wherein the physical layout design includes one or more probe locations for one or more nodes of the integrated circuit as specified in the netlist; and
   fabricating the integrated circuit according to the physical layout design, wherein the fabricated integrated circuit includes the one or more probe locations.

2. The method as recited in claim 1, wherein said fabricating comprises fabricating the integrated circuit at least partially on the frontside of a semiconductor substrate, and wherein the one or more probe locations of the integrated circuit provide an electrical contact to probe one or more corresponding nodes of the integrated circuit from a backside of the semiconductor substrate.

3. The method as recited in claim 2, further comprising testing the integrated circuit by measuring one or more characteristics of the integrated circuit by probing the one or more backside probe locations from the backside of the semiconductor substrate.

4. The method as recited in claim 1, wherein said specifying one or more probe cells in a netlist comprises:
   indicating a location of each of one or more of the probe cells in a functional description of the integrated circuit; and
   generating the netlist from the functional description.

5. The method as recited in claim 4, wherein the functional description is written in a hardware description language (HDL).

6. The method as recited in claim 5, wherein the HDL description specifies the probe cell locations.

7. The method as recited in claim 1, wherein said specifying one or more probe cells in a netlist comprises:
   providing a functional description of the integrated circuit;
   generating the netlist from the functional description; and
   editing the netlist to indicate a location of each of one or more of the probe cells.

8. A computer accessible medium comprising program instructions executable for:
   generating a description representing a design for an integrated circuit, wherein the description specifies one or more probe locations for providing an electrical contact to externally probe one or more corresponding nodes of the integrated circuit; and
   mapping the description to a physical layout design for the integrated circuit, wherein the physical layout design includes one or more probe locations for one or more nodes of the integrated circuit as specified in the description, wherein the physical layout design provides information for fabricating the integrated circuit including the one or more probe locations according to the physical layout design.

9. The computer accessible medium as recited in claim 8, wherein the description is written in a hardware description language (HDL).

10. The computer accessible medium as recited in claim 9, wherein the HDL description specifies the probe cell locations.

11. The computer accessible medium as recited in claim 10, wherein said mapping comprises:
    generating a netlist from the HDL description; and
    mapping the netlist into the physical layout design.

12. The computer accessible medium as recited in claim 8, wherein the description comprises a netlist specifying the one or more probe locations for one or more nodes of the integrated circuit.

13. The computer accessible medium as recited in claim 8, wherein said generating a description comprises:
    synthesizing a functional description of the design for the integrated circuit into a netlist; and
    editing the netlist to include the one or more probe locations.

14. The computer accessible medium as recited in claim 8, wherein the program instructions are further executable to implement one or more circuit component libraries, wherein the one or more circuit component libraries comprise cells representing circuit functions, wherein the cells include a probe cell, wherein said generating a description comprises specifying one or more probe cells in the description.

15. A computer system, comprising:
    memory; and
    one or more processors coupled to the memory, wherein the one or more processors are configured to execute instructions stored in the memory, wherein the instructions comprise instructions for:

generating a description representing a design for an integrated circuit, wherein the description specifies one or more probe locations for providing an electrical contact to externally probe one or more corresponding nodes of the integrated circuit; and mapping the description to a physical layout design for the integrated circuit, wherein the physical layout design includes one or more probe locations for one or more nodes of the integrated circuit as specified in the description, wherein the physical layout design provides information for fabricating the integrated circuit including the one or more probe locations according to the physical layout design.

16. The computer system as recited in claim 15, wherein the description is written in a hardware description language (HDL).

17. The computer system as recited in claim 16, wherein the HDL description specifies the probe cell locations.

18. The computer system as recited in claim 17, wherein said mapping comprises:

generating a netlist from the HDL description; and
mapping the netlist into the physical layout design.

19. The computer system as recited in claim 15, wherein the description comprises a netlist specifying the one or more probe locations for one or more nodes of the integrated circuit.

20. The computer system as recited in claim 15, wherein said generating a description comprises:

synthesizing a functional description of the design for the integrated circuit into a netlist; and editing the netlist to include the one or more probe locations.

21. The computer system as recited in claim 15, wherein the program instructions are further executable to implement one or more circuit component libraries, wherein the one or more circuit component libraries comprise cells representing circuit functions, wherein the cells include a probe cell, wherein said generating a description comprises specifying one or more probe cells in the description.

* * * * *